United States Patent
Xiang

(10) Patent No.: US 6,709,960 B1
(45) Date of Patent: Mar. 23, 2004

(54) LASER ANNEAL PROCESS FOR REDUCTION OF POLYSILICON DEPLETION

(75) Inventor: Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 239 days.

(21) Appl. No.: 10/017,464

(22) Filed: Dec. 18, 2001

(51) Int. Cl.[7] .............................................. H01L 21/425
(52) U.S. Cl. ...................... 438/530; 438/197; 438/514; 438/308
(58) Field of Search ................................. 438/197, 514, 438/530, 308, 287, 301, 528

(56) References Cited

U.S. PATENT DOCUMENTS

| | | | | |
|---|---|---|---|---|
| 6,093,589 A | * | 7/2000 | Lo et al. | 438/197 |
| 6,284,630 B1 | * | 9/2001 | Yu | 438/511 |
| 6,291,327 B1 | * | 9/2001 | Li et al. | 438/530 |
| 6,495,406 B1 | * | 12/2002 | Honeycutt | 438/197 |

* cited by examiner

*Primary Examiner*—Long Pham
*Assistant Examiner*—(Vikki) Hoa B. Trinh

(57) ABSTRACT

A method of manufacturing a MOSFET semiconductor device includes forming a gate electrode oxide over a substrate; depositing a first layer of polysilicon over the gate oxide; implanting dopants in the first layer; depositing a second layer of polysilicon over the first layer; etching both layers to form a gate electrode; forming source/drain extensions in the substrate; forming first and second sidewall spacers; implanting dopants within the substrate to form source/drain regions in the substrate; and laser thermal annealing to activate the source/drain regions and to melt the first layer. The first layer can have a depth of about 200 to 500 angstroms, and the second layer can have a depth of about 300 to 4500 angstroms. The source/drain extensions can have a depth of about 50 to 300 angstroms, and the source/drain regions can have a depth of about 400 to 1000 angstroms. The laser thermal annealing can also melt amorphitized portions of the second layer.

13 Claims, 4 Drawing Sheets

LASER ANNEAL PROCESS FOR REDUCTION OF POLYSILICON DEPLETION

FIELD OF THE INVENTION

The present invention relates to the manufacturing of semiconductor devices, and more particularly, to laser anneal processes that prevent polysilicon depletion.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS semiconductor device generally includes a semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

MOS devices typically fall in one of two groups depending the type of dopants used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

A type of device, commonly referred to as a MOS field-effect-transistor (MOSFET), includes a channel region formed in the semiconductor substrate beneath the gate area or electrode and between the source and drain regions. The channel is typically lightly doped with a dopant having a conductivity type opposite to that of the source/drain regions. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner an electric field is used to control the current flow through the channel region.

The semiconductor industry is continually striving to improve the performance of MOSFET devices. The ability to create devices with sub-micron features has allowed significant performance increases, for example, from decreasing performance degrading resistances and parasitic capacitances. The attainment of sub-micron features has been accomplished via advances in several semiconductor fabrication disciplines. For example, the development of more sophisticated exposure cameras in photolithography, as well as the use of more sensitive photoresist materials, have allowed sub-micron features, in photoresist layers, to be routinely achieved. Additionally, the development of more advanced dry etching tools and processes have allowed the sub-micron images in photoresist layers to be successfully transferred to underlying materials used in MOSFET structures.

As the dimensions of the MOSFET shrinks, the reduction in effective gate length requires a proportional scaling in the vertical junction depth of the source/drain regions. The reduction in the junction depth of the source/drain regions is to reduce short channel effects.

As the distance between the source region and the drain region of the MOSFET (i.e., the physical channel length) decreases, in the effort to increase circuit speed and complexity, the junction depth of source/drain regions must also be reduced to prevent unwanted source/drain-to-substrate junction capacitance. However, obtaining these smaller junction depths test the capabilities of current processing techniques, such as ion implantation with activation annealing using rapid thermal annealing. Rapid thermal annealing typically involves heating the silicon wafer, after implanting, under high-intensity heat lamps. Implanting or doping creates an amorphitizes the silicon substrate, and the activation annealing is used to recrystallize the amorphitized silicon region.

As a result of the limitations of rapid thermal annealing, laser thermal annealing is being implemented, particularly for ultra-shallow junction depths. Laser thermal annealing may be performed after ion implantation of a dopant and involves heating the doped area with a laser. The laser radiation rapidly heats the exposed silicon such that the silicon begins to melt. The diffusivity of dopants into molten silicon is about 8 orders of magnitude higher than in solid silicon. Thus, the dopants distribute almost uniformly in the molten silicon and the diffusion stop almost exactly at the liquid/solid interface. The heating of the silicon is followed by a rapid quench to solidify the silicon, and this process allows for non-equilibrium dopant activation in which the concentration of dopants within the silicon is above the solid solubility limit of silicon. Advantageously, this process allows for ultra-shallow source/drain regions that have an electrical resistance about one-tenth the resistance obtainable by conventional rapid thermal annealing.

The abbreviation for MOS (metal-oxide-semiconductor) can be somewhat of a misnomer, as the gate, in many applications, is formed of a polysilicon material deposited over a gate oxide with the polysilicon material being doped to render it conductive. One problem that is encountered with the formation of ultra-shallow source/drain regions results from the polysilicon gate thickness not being scaled down at the same rate as the source/drain regions. Consequently, this scaling discrepancy worsens polysilicon depletion, which is also known as poly depletion. As commonly understood by those skilled in the art, poly depletion worsens when an anneal subsequent to the doping of a polysilicon gate is insufficient to drive the implanted dopants down the entire depth of the polysilicon gate. Consequently, a portion of the polysilicon gate nearest the gate oxide is depleted of dopants and behaves as an insulating region. As a result, the resulting transistor behaves as though the gate oxide is substantially thicker, thereby resulting in a substantial degradation of device performance or even rendering the device inoperable.

Increasing the implant energy or subsequent anneal time to remedy the poly depletion creates another problem, as these process modifications can cause the shallow source/drain regions to increase in depth. Consequently, a performance trade-off exists between reduced poly depletion and ultra-shallow source/drain junctions. Accordingly, a need exists for an improved process that has the benefits of laser thermal annealing while minimizing poly depletion.

SUMMARY OF THE INVENTION

This and other needs are met by embodiments of the present invention which provide a method of manufacturing a semiconductor device that reduces poly depletion. The method comprises forming a gate electrode oxide over a substrate; depositing a first layer of polysilicon over the gate oxide; implanting dopants in the first layer; depositing a second layer of polysilicon over the first layer, etching both layers to form a gate electrode; forming source/drain extensions in the substrate; forming first and second sidewall spacers; implanting dopants within the substrate to form source/drain regions in the substrate; and laser thermal annealing to activate the source/drain regions and to melt the first layer.

The doping of the first layer of polysilicon amorphitizes the first layer, and subsequent laser thermal annealing melts the amorphitized first layer. Also, the doping of the first layer provides a high concentration of dopants at the interface of the gate oxide and the gate electrode after the first layer has been melted. This high concentration of dopants improves the conductivity of the polysilicon layer and reduces poly depletion effects.

In a further aspect of the present invention, the first layer can have a depth of about 200 to 500 angstroms, and the second layer can have a depth of about 300 to 4500 angstroms. Also, the source/drain extensions can have a depth of about 50 to 300 angstroms, and the source/drain regions can have a depth of about 400 to 1000 angstroms. Furthermore, the laser thermal annealing can also melt amorphitized portions of the second layer.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves the problem of poly depletion as a result of dopants not being driven down the entire depth of a polysilicon gate electrode after annealing. This is achieved, in part, by depositing a first layer of polysilicon or amorphous silicon over a gate oxide and then doping this layer to amorphitize the polysilicon layer. Another layer of polysilicon is formed over the first polysilicon layer and these two layers eventually form the gate electrode. As a result of laser thermal annealing, the dopants in the polysilicon layers distribute almost uniformly in the molten silicon of the gate electrode. Because the first layer was doped at a concentration higher than the solubility limit, a high concentration of dopants exists in the first layer at the interface of the gate oxide and gate electrode, which will, therefore, reduce poly depletion effects.

An embodiment of the present invention is illustrated in FIGS. 1A–1H. A silicon substrate is provided and can be formed from any material suitable for integrated circuit manufacture. However, in one aspect, the substrate is formed from single-crystal silicon, with a <100> crystallographic orientation and which has been slightly doped with n-type or p-type impurities. Separate MOS devices are separated on the silicon substrate using isolation structures, such as a field oxide or a shallow isolation trench (not shown).

A shallow isolation trench, for example, can be formed by etching either isotropically with wet techniques or anisotropically with dry etch techniques. An oxide is thereafter deposited within the trench. As an alternative to the shallow isolation trench, a field oxide can be formed. A field oxide is typically formed via thermal oxidation in an oxygen-steam ambient at temperatures from about 850 to 1050° C. A patterned, oxidation-resistant mask can be used to prevent oxidation of non-isolation device regions. After formation of the field oxide, the mask is removed using known techniques, for example hot phosphoric acid for a silicon nitride mask or buffered hydrofluoric acid for a pad oxide mask.

Figure 1A:
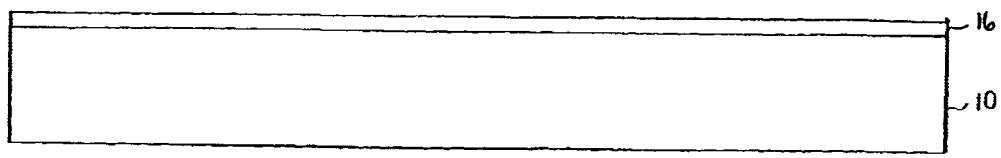
FIGS. 1A–1H schematically illustrate sequential phases of a MOS fabrication method using a laser thermal annealing process in conjunction with a polysilicon/amorphous silicon stack gate electrode according to an embodiment of the present invention.

In FIG. 1A, a gate oxide 16, comprised of silicon dioxide, is formed on the top surface of the substrate 10, for example, using thermal oxidation at temperatures from about 700 to 1000° C. in an oxygen-steam ambient. Although not limited in this manner, the gate oxide 16 can have a thickness from about 30 to 200 angstroms. After deposition of the gate oxide 16, a gate electrode is formed over the gate oxide 16.

Figure 1B:
Figure 1B:
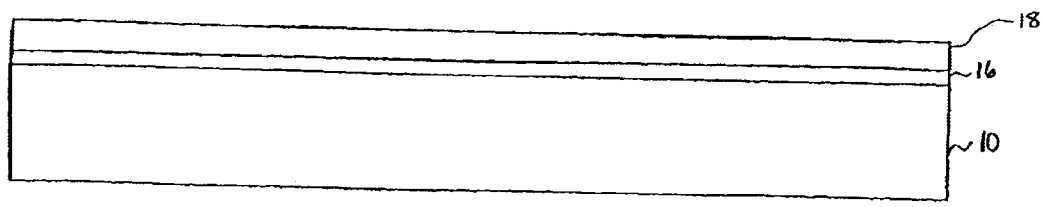

In FIG. 1B, the formation of a gate electrode typically involves depositing a first blanket layer of undoped polysilicon 18, for example by low pressure chemical vapor deposition (LPCVD) at temperatures from about 600 to 800° C., on the top surface of gate oxide 16. Although not limited in this manner, the polysilicon layer 18 can have a thickness from about 100 to 500 angstroms. The polysilicon layer 18 is then implanted with dopants, as depicted by arrows 20, which amorphitizes the layer 18. Illustrative examples of implant energies and dosages for doping respectively range from about 2 to 20 keV and from about $5 \times 10^{14}$ to $3 \times 10^{15}$ dopants/cm². Although not limited in this manner, the first layer 18 is doped at a concentration higher than the solubility limit of the polysilicon.

Figure 1C:
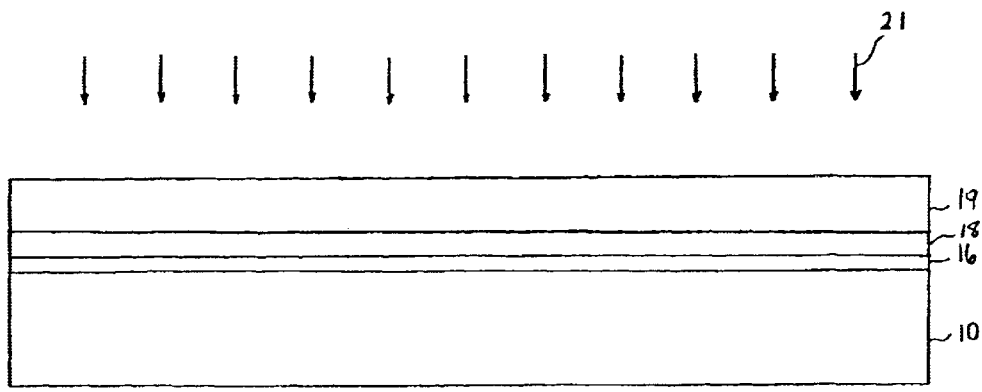

In FIG. 1C, a second layer of undoped polysilicon 19 is deposited over the amorphous layer 18. Although not limited in this manner, the second polysilicon layer 19 can have a thickness from about 300 to 4500 angstroms. The second polysilicon layer 19 can then be implanted with nitrogen ions, as depicted by arrows 21. The implanted nitrogen ions, for example, can be used to retard the diffusion of boron atoms. The implantation of the nitrogen ions can be at a dosage from about $5 \times 10^{14}$ to $5 \times 10^{15}$ dopants/cm$^2$, and at an energy level from about 20 to 200 keV.

Figure 1D:
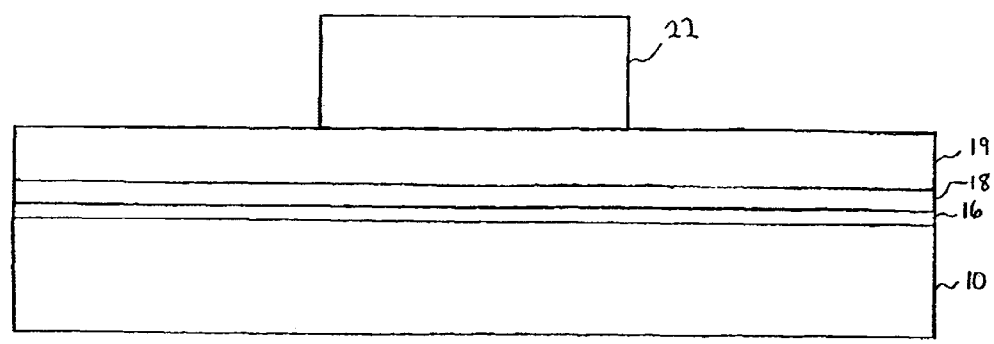

In FIG. 1D, the layers over the gate oxide 16 are etched to form the gate electrode. The etching of the gate typically involves forming a photoresist 22 on the polysilicon layer 19, and the photoresist 22 is selectively irradiated using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the polysilicon layer 19 and the amorphous layer 18, which will thereby define the gate electrode.

Figure 1E:
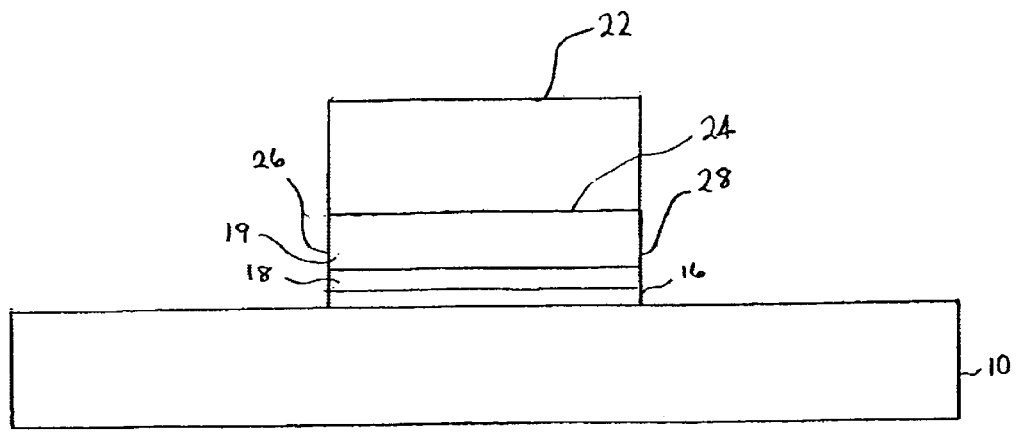

In FIG. 1E, an etch, typically anisotropic, is applied to remove the exposed portions of the polysilicon layer 18 and the underlying portions of the gate oxide 16. After etching, the remaining portion of the polysilicon layer 19 and the amorphous layer 18 provides a gate electrode 24 having opposing vertical sidewalls 26, 28. Although not limited in this manner, the width of the gate electrode 24 between the sidewalls 26, 28 can be from about 250 to 2500 angstroms.

Figure 1F:
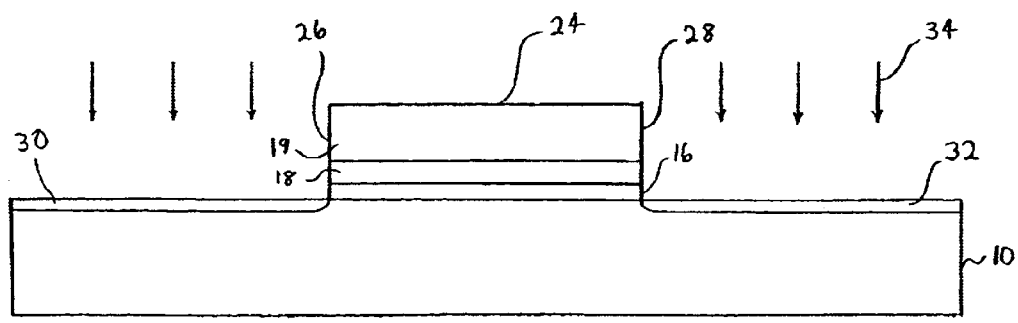

In FIG. 1F, the photoresist 22 is stripped, and lightly doped (LDD) source/drain extensions 30, 32 are formed by an ion implantation, as represented by arrows 34. The ion implantation may be an n-type dopant, such as arsenic or phosphorus, if an NMOSFET is desired, or a p-type dopant, such as boron, if a PMOSFET is desired. Illustrative examples of implant energies and dosages for doping respectively range from about 2 to 20 keV and from about $5 \times 10^{14}$ to $3 \times 10^{15}$ dopants/cm$^2$. The source/drain extensions 30, 32 are formed within the substrate 10 immediately adjacent to the sidewalls 26, 28 and are self-aligned with the gate electrode 24. After implantation, annealing is conducted to activate the source/drain extensions 30, 32 and to recrystallize the extensions. Alternatively, the annealing can occur after formation of the source/drain regions. Typically, the source/drain extensions 30, 32 extend down from the surface of the silicon substrate 10 to a depth of about 50 angstroms to 300 angstroms.

Figure 1G:
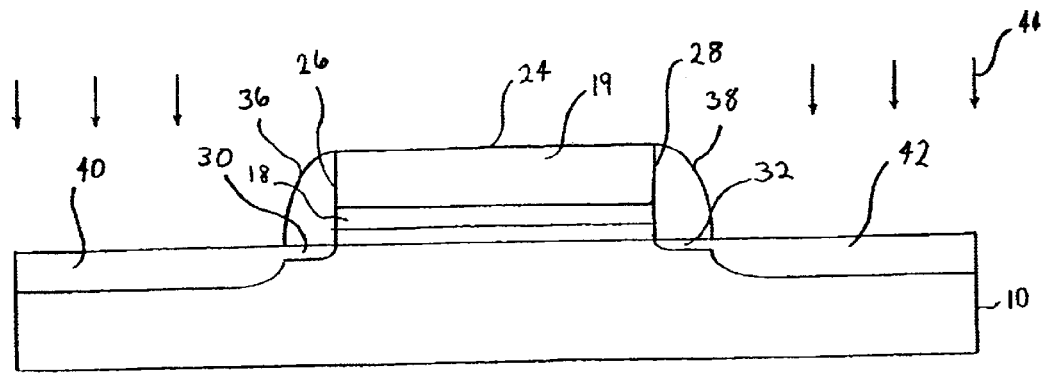

In FIG. 1G, sidewall spacers 36, 38 are formed following the implantation of the source/drain extensions 30, 32. Formation of the sidewall spacers 36, 38 involves blanket depositing a spacer material over the substrate 10. The spacer material can be silicon nitride or some other material such as plasma-enhanced oxide (PEOX) or tetraethoxysilane (TEOS) oxide. The blanket deposition is followed by an anisotropic etch, which removes the spacer material except for the sidewall spacers 26, 28 immediately adjacent to the sidewalls 26, 28 of the polysilicon gate electrode 24 and over the substrate 10.

After formation of the sidewall spacers 36, 38, heavily doped (HDD) or moderately doped (MDD) source/drain regions 40, 42 are formed by a second ion implantation, as represented by arrows 44. The source/drain regions 40, 42 are formed within the substrate 10 and extend past the source/drain extensions 30, 32 immediately adjacent to the sidewall spacers 36, 38. The sidewall spacers 36, 38 act as masks, which protect portions of the source/drain extensions 30, 32 from being heavily doped. Illustrative examples of implant energies and dosages for doping respectively range from about 10 keV to 60 keV and from about $1 \times 10^{14}$ to $5 \times 10^{14}$ dopants/cm$^2$. The doping of the source/drain regions 40, 42 amorphitizes the silicon, which must then be recrystallized to activate the source/drain regions 40, 42. The doping also amorphitizes at least a portion of the second polysilicon layer 19 of the gate electrode 24.

Figure 1H:
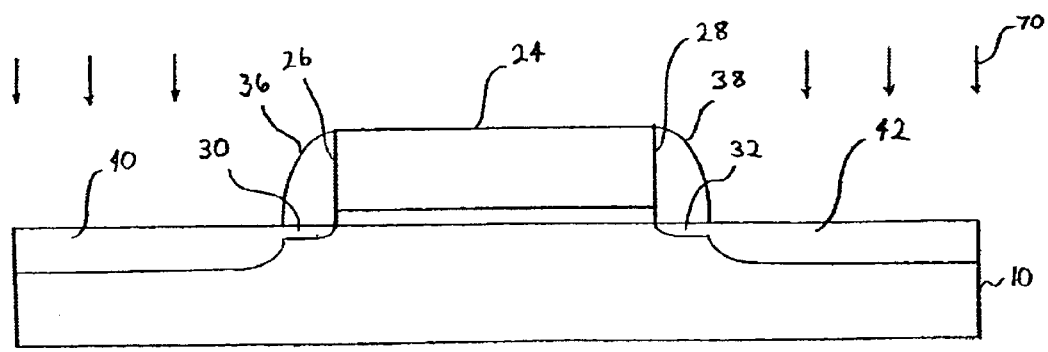

In FIG. 1H, after implantation of the source/drain regions 40, 42, these regions are activated using a laser thermal annealing process. The same laser thermal annealing process concurrently melts the amorphitized layers of the gate electrode 24. As a result, the dopants in the amorphitized layers advantageously distribute almost uniformly in the molten silicon of the gate electrode 24. Because the first layer was doped at higher concentration than the solubility limit, a higher concentration than the solubility limit concentration of dopants will exist in the gate electrode 24. The high concentration of dopants throughout the gate electrode 24, in particular, at the interface of the gate oxide 16 and gate electrode 24, will, therefore, reduce poly depletion effects. This reduction in poly depletion effects decreases the capacitance at the gate oxide 16, which advantageously allows for increased speed performance of the MOS device.

The energy from the laser, represented by arrows 70 in FIG. 1H, is applied to liquefy the substrate 10 to the desired depth of source/drain regions 40, 42. An example of a laser capable of providing this energy to melt the amorphitized layers of the gate electrode 24 and liquefy the substrate 10 is a spatially homogenized 308 nm XeCl pulsed laser. However, the invention is not limited in this manner, and the energy and power of the laser can vary in accordance with different applications. Typically, the source/drain regions 40, 42 extend down from the surface of the silicon substrate 10 to a depth of about 400 angstroms to about 1000 angstroms.

After the silicon has been melted, which is for approximately 30–100 nanoseconds, the silicon will cool rapidly, within about one microsecond, and the silicon will reform epitaxially. In so doing, damage caused by the implant process will be removed. The energy fluence of the laser at the surface determines the melt duration that occurs at the surface, and melt duration is related to maximum melt depth. The relationship between melt time and maximum melt depth depends on the temporal profile of the laser beam. Precise control of junction depth is possible due to the capability of measuring the full width height maximum (FWHM) of the laser and the surface melt duration during the process Relatively large changes in the energy fluence are required to create small changes in the maximum melt depth. The dosage is controlled by the total melt time. The total melt time can be varied by varying the number and/or energy of the laser pulses. For example, a fluence range of approximately 750 mJ/cm$^2$ to 1.3 J/cm$^2$ results injunction depths ranging from 200 angstroms to 1500 angstroms from a 308 nm excimer laser at a 9 Hz repetition rate.

The fluence range for laser irradiation can extend all the way from about 50 mJ/cm$^2$ to about 1.3 J/cm$^2$. However, the fluence of the laser can be advantageously controlled to melt only to a depth that the silicon has been amorphitized because amorphized silicon absorbs energy at a higher rate than crystalline silicon. For example, a fluence of about 400 mJ/cm$^2$ can be used to melt amorphized silicon and not melt crystalline silicon.

The present invention can be practiced by employing conventional materials, methodology and equipment.

Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising the steps of:
    forming a gate oxide over a substrate;
    depositing a first layer of silicon over the gate oxide;
    implanting dopants into the first layer;
    depositing a second layer of silicon over the first layer;
    etching the first and second layers to form a gate electrode;
    implanting dopants within the substrate to form source/drain regions in the substrate; and
    melting at least the first layer by laser thermal annealing.

2. The method of manufacturing a semiconductor device according to claim 1, wherein the first layer has a depth of about 200 to 500 angstroms.

3. The method of manufacturing a semiconductor device according to claim 2, wherein the second layer has a depth of about 300 to 4500 angstroms.

4. The method of manufacturing a semiconductor device according to claim 1, wherein said step of implanting dopants in the first layer amorphizes the first layer.

5. The method of manufacturing a semiconductor device according to claim 1, wherein said step of implanting dopants to form the source/drain regions implants dopants into the second layer and amorphitizes at least a portion of the second layer.

6. The method of manufacturing a semiconductor device according to claim 5, wherein said step of melting the first layer also melts the amorphitized portion of the second layer.

7. The method of manufacturing a semiconductor device according to claim 1, wherein the first layer is doped at a concentration higher than a solubility limit of the dopants in the first layer.

8. The method of manufacturing a semiconductor device according to claim 1, further comprising the steps of forming source/drain extensions in the substrate adjacent to the gate electrode and forming sidewall spacers adjacent to the gate electrode.

9. The method of manufacturing a semiconductor device according to claim 8, wherein the source/drain extensions have a depth of about 50 to 300 angstroms.

10. The method of manufacturing a semiconductor device according to claim 1, wherein the source/drain regions have a depth of about 400 to 1000 angstroms.

11. The method of manufacturing a semiconductor device according to claim 1, wherein the laser thermal annealing activates the source/drain regions.

12. The method of manufacturing a semiconductor device according to claim 1, wherein the semiconductor device is a MOSFET.

13. A method of manufacturing a MOSFET semiconductor device, comprising the steps of:
    forming a gate oxide over a substrate;
    depositing a first layer of silicon over the gate oxide to a depth of about 200 to 500 angstroms;
    implanting dopants into the first layer at a concentration higher than a solubility limit of the dopants in the first layer;
    depositing a second layer of silicon over the first layer to a depth of about 300 to 4500 angstroms;
    etching the first and second layers to form a gate electrode;
    forming source/drain extensions in the substrate adjacent to the gate electrode to a depth of about 50 to 300 angstroms;
    implanting dopants within the substrate to form amorphitized source/drain regions in the substrate adjacent to the sidewall spacers to a depth of about 400 to 1000 angstroms and to amorphitize at least a portion of the second layer; and
    melting the amorphitized first and second layers by laser thermal annealing,
    wherein the laser thermal annealing activates the source/drain regions.

* * * * *